United States Patent [19]

Yonehara

[11] Patent Number: 5,278,093
[45] Date of Patent: Jan. 11, 1994

[54] METHOD FOR FORMING SEMICONDUCTOR THIN FILM

[75] Inventor: Takao Yonehara, Atsugi, Japan

[73] Assignee: Canon Kabushiki Kaisha, Tokyo, Japan

[21] Appl. No.: 919,372

[22] Filed: Jul. 29, 1992

Related U.S. Application Data

[63] Continuation of Ser. No. 587,111, Sep. 24, 1990, abandoned.

[30] Foreign Application Priority Data

Sep. 23, 1989 [JP] Japan .................................. 1-247662

[51] Int. Cl.$^5$ .............................................. H01L 21/20
[52] U.S. Cl. ...................................... 437/109; 437/108; 437/966; 437/973; 437/173; 148/DIG. 1; 148/DIG. 154
[58] Field of Search ............... 437/173, 942, 966, 973, 437/109, 108; 148/DIG. 1, DIG. 3, DIG. 152, DIG. 154

[56] References Cited

U.S. PATENT DOCUMENTS

| | | | |
|---|---|---|---|
| 4,331,485 | 5/1982 | Gat | 437/942 |
| 4,356,384 | 10/1982 | Gat | 437/942 |
| 4,617,066 | 10/1986 | Vasuder | 437/942 |
| 4,621,413 | 11/1986 | Lowe et al. | 437/942 |
| 4,752,590 | 6/1988 | Adams et al. | 437/942 |
| 4,808,546 | 2/1989 | Moniwa et al. | 437/973 |
| 4,814,292 | 3/1989 | Sasuki et al. | 148/DIG. 1 |
| 4,992,846 | 2/1991 | Sakakibara et al. | 437/973 |

FOREIGN PATENT DOCUMENTS

| | | |
|---|---|---|
| 58-54606 | 4/1983 | Japan . |
| 63-253616 | 10/1988 | Japan . |
| 8904550 | 5/1989 | PCT Int'l Appl. . |

OTHER PUBLICATIONS

"Crystal Defect Study of Solid Phase Epitaxially Grown Si Surrounded by SiO2 Structures," E. Murakami et al., Extended Abstracts of the 20th (1988 International) Conference on Solid State Devices and Materials, Tokyo, Aug. 24–26, 1988, pp. 185–188.

"Characterization of Solid–Phase Epitaxially–Grown Silicon Films on SiO2," M. Tamura et al., Japanese Journal of Applied Physics, vol. 23, No. 10, part 1, Oct. 1984, pp. 1294–1299.

"Two–beam laser recrystallization of polycrystalline silicon on an insulating substrate," S. Dasgupta et al., Journal of Applied Physics, Woodbury, N.Y., vol. 64, No. 4, Aug. 15, 1988, pp. 2069–2075.

"Crystallization of Amorphous Silicon Films Using a Multistep Thermal Annealing Process," E. Korin et al., Thin Solid Films, Lausanne, CH, vol. 167, No. 1, Dec. 15, 1988, pp. 101–106.

"Low–temperature SOI (Si–on–insulator) formation by lateral solid–phase epitaxy," M. Miyao et al., Journal of Applied Physics, Woodbury, N.Y., vol. 64, No. 6, Sep. 15, 1988, pp. 3018–3023.

"Polysilicon Super Thin Film Transistor Technology," T. Noguchi et al., Polysilicon Films and Interfaces, Materials Research Society Symposium Proceedings, vol. 106, pp. 293–305.

Primary Examiner—Brian E. Hearn
Assistant Examiner—Linda J. Fleck
Attorney, Agent, or Firm—Fitzpatrick, Cella, Harper & Scinto

[57] ABSTRACT

A method for forming a semiconductor thin film comprises crystallizing an amorphous silicon thin film by a first thermal treatment at 700° C. or lower for ten hours or longer and carrying out a second thermal treatment at 1200° C. or higher in which a lamp light is radiated to the crystallized thin film.

25 Claims, 1 Drawing Sheet

METHOD FOR FORMING SEMICONDUCTOR THIN FILM

This application is a continuation of application Ser. No. 07/587,111 filed Sep. 24, 1990, which is now abandoned.

BACKGROUND OF THE INVENTION

1. Field of the Invention

The present invention relates to a method for forming a semiconductor thin film applied to, for example, structural elements of a three dimensional integrated circuit or a large area electronic element.

2. Related Background Art

In the past, the method for growing a solid phase by exposing an amorphous thin film previously formed on a substrate to a thermal treatment at a low temperature below the melting point has been proposed as a method for forming a crystalline thin film on an amorphous substrate.

For example, there has been a technique reported in which a polycrystalline Si thin film having a grain size of 5 μm can be formed according to the procedure comprising effecting a solid phase growth by exposing an amorphous Si thin film having a film thickness of about 100 nm formed on amorphous $SiO_2$ and modified to an amorphous state by ion implantation, to thermal treatment at 600° C. for several ten hours under $N_2$ atmosphere, whereby the amorphous Si thin film is crystallized. (T. Noguti, H. Hayashi and H. Ohshima, 1987, Mte. Res. Soc. Symp. Proc. 106, Polysilicon and Interfaces, 293, Elsevier Science Publishing, New York 1899).

The grain size of the polycrystalline thin film obtained by this method is about 100 times larger than that of the polycrystal film deposited by a reduced pressure CVD method. Therefore, it is possible to make a high performance electronic element on the thin film. For example, the electron mobility of a field effect transistor (MOSFET) formed on the thin film obtained by the above method is several times to several ten times higher than that of MOSFET formed on the polycrystal thin film deposited by the reduced pressure CVD method as such. More concretely, when a P channel or N channel MOSFET is produced, the carrier mobility of the latter is about 50 $cm^2/V.sec$ and that of the former is 100 $cm^2/V.sec$.

However, the inventer found that this technique had the problems described below. That is, it was surmised that a large amount of crystal defects were present inside each crystal grain since the crystal growing pattern in this technique was the dendritic growth effected by introducing a twin crystal grain boundary and indeed, as the result of actual observation of the crystallographic structure by using a transmission electron microscope, the inventer found that the large amount of defect groups existed and the carrier mobility was restricted.

On the other hand, high temperature local thermal treatment employing an energy beam (coherent light (laser light), electron beam, ion beam, etc.) has been reported as a technique for growing a crystal on an amorphous insulator substrate. In this method, crystallization is achieved by focusing an energy beam and heating a local area to nearly the melting point. Due to the local heating, the process essentially can be a low temperature process without raising the temperature of the whole substrate. However, the local heating causes many problems with relation to productivity and controllability both. The reason is as follows: For thermally treating the whole surface of a substrate with a large area, it is absolutely necessary to scan a beam. In addition, a long time is required for uniformly treating the large area since it is necessary to finely adjust the degree of overlap of a beam, the depth of a focus, etc. during the beam scanning.

SUMMARY OF THE INVENTION

An object of the present invention is to provide a method for forming a semiconductor thin film by which said film with a large grain size and less intragrain defects can be uniformly formed in the lump over a large area in a short time.

Another object of the present invention is to provide a method for forming a semiconductor thin film by which said film with a large grain size and no intragrain defects can be uniformly formed in the lump over a large area in a short time to give remarkable improvement in the property of the device produced.

According to the present invention, there is a method provided for forming a semiconductor thin film which comprises crystallizing an amorphous silicon thin film by a first thermal treatment at 700° C. or lower for ten hours or longer and then carrying out a second thermal treatment at 1200° C. or higher effecting a lamp light irradiation to said crystallized thin film.

DETAILED DESCRIPTION OF THE PREFERRED EMBODIMENTS

Figure 1:
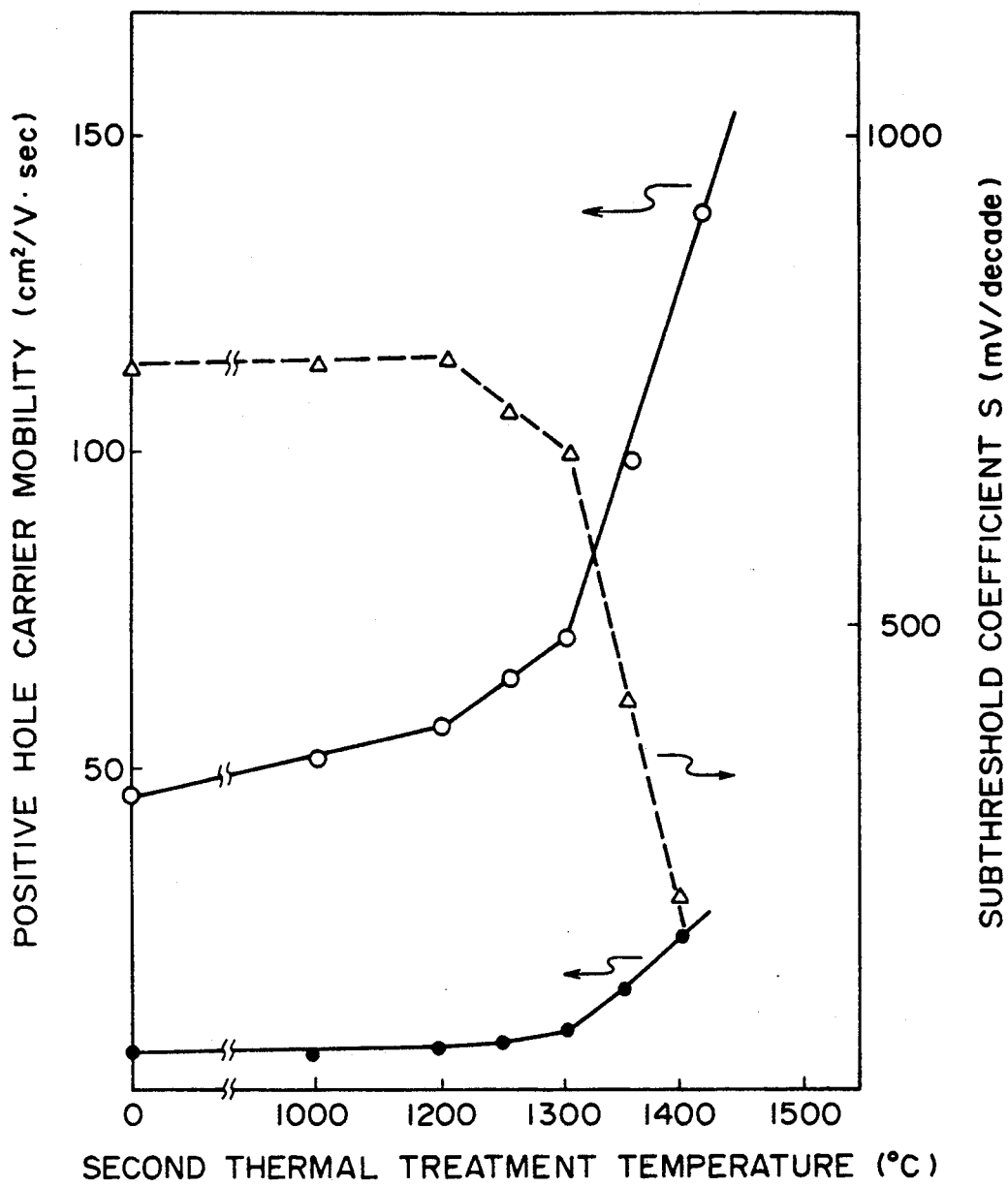
FIG. 1 is a graphic chart showing the influence of the heating temperature in the second thermal treatment upon the element properties.

The following description is for explaining in detail the effect and constitution of the present invention with the knowledge obtained in the course of accomplishing the present invention.

During a thermal treatment in which a lamp light was radiated to an amorphous Si thin film, the inventer carefully observed the crystal structure of a large number of samples before and after the radiation by using a transmission electron microscope to obtain the important results described below.

A) A tungsten halogen lamp light (0.5 to 3.5 μm in wave length) was radiated directly to an amorphous Si thin film and this film was heated to 1100° C. or higher for 1 to 3 minutes, whereby the film was crystallized. Specifically, by a heating treatment at 1200° C. or higher, a polycrystalline thin film having a grain size of 1 μm or less was formed. Inside the grain, an equal inclination interference fringe pattern was observed. Therefore, it was found that the thin film had less defects.

B) An amorphous Si thin film was exposed to a thermal treatment at 700° C. for 10 to 100 hours to effect a solid phase growth. After a large grain size dendritic crystal of 1 μm or more in a grain size was grown, a light irradiation by a lamp was conducted at a temperature of 1100° C. or higher to decrease the amount of crystal defect in the grain (lamination defect, micro twin crystal, transposition, vacancy, etc.) as described in the above item A). Specifically, it was found that the amount of crystal defect was remarkably decreased by the thermal treatment at 1200° C. or higher. Further, in this case, it should be noted that movement and disappearance of the grain boundary were not observed.

C) In the items A) and B), it was found that as the temperature was elevated to 1300° C., 1400° C. and higher (heating time: 3 minutes), the amount of defect in the grain was decreased. These phenomena are understood as described as follows.

In the case of the item A), the amorphous Si thin film is heated at a stroke to 1100° C. or higher, whereby the nucleation rate in the solid phase becomes higher than that in the item B) and the grain size determined by the grain boundary formed by collision between the grains becomes minute, 1 $\mu$m or less. Further, it is inferred that the movement and disappearance of defects are caused by decrease of the free energy of the defects as a driving force. At the same time, the grain growth is also effected by decrease of the grain boundary energy as a driving force.

In the item B), since the low temperature annealing is caused, the nucleation rate in a solid phase is slowly restricted, whereby the grain size becomes 1 micron or more under the thermal treatment at 700° C. or lower for 10 hours. That is, the dendritic polycrystal with a large grain size is grown and then heated to 1200° C. using a lamp, whereby the movement and disappearance of defect groups are caused by decrease of the defect energy inside the grain as a driving energy. However, the maximal grain size is as large as 1 $\mu$m or more, the state of grain boundary energy is lower than that in the item A) and a grain growth with movement of a grain boundary is not effected. A transistor (P channel field effect transistor) was formed in the Si thin film modified to the crystal structure which was uniform over a large area. In FIG. 1, positive hole carrier mobility and subthreshold property are plotted vs. a lamp heating temperature. The plot of the black circle mark (●) shows the data concerning the sample of the item A) in which the MOSFET is formed in the film formed by directly treating amorphous Si at a high temperature by lamp heating. The positive hole carrier mobility shows less change and is 10 cm$^2$/V.sec or less in the thermal treatment at a temperature lower than 1200° C. However, in the thermal treatment at 1300° C. or higher, the mobility is rapidly improved to be more than 10 cm$^2$/V.sec. The subthreshold coefficient is 1000 mV/decade or more. Therefore, the quality is so inferior that the plot is outside the graph.

The white circle mark (O) shows the change of the positive hole carrier mobility of the sample of the above item B) in which solid phase growth of an amorphous Si thin film is effected at a low temperature to make a large grain size of 1 $\mu$m or more and then a lamp light is radiated, and MOSFET is prepared therein. The triangle mark ($\Delta$) shows the change of subthreshold coefficient. Even to a transistor, which is formed in a film formed by a low temperature solid phase growth as such, before a lamp radiation, the carrier mobility is more than 40 cm$^2$/V.sec Further, the mobility is gently increased up to 1200° C. to become 58 cm$^2$/V.sec.

Further, by heating using a light irradiation at 1200° C. or higher, the mobility is dramatically increased. At 1400° C. or higher, it becomes 140 cm$^2$/V.sec and is greatly improved. It is found that the mobility is remarkably increased in particular at 1300° C. or higher. On the other hand, the subthreshold property is 700 mV/decade up to 1200° C. The decrease in this property occurs at 1200° C. or higher, and a particularly remarkable improvement is found at 1300° C. or higher.

To sum up, the semiconductor amorphous thin film is exposed to a first treatment at 700° C. or lower for 10 hours or longer to lower the nucleation rate in the solid phase and grow a dendritic crystal having a large grain size of a micron order in a maximal grain size. Next, the thermal treatment at 1200° C. or higher (the thermal treatment carried out by radiating a lamp light to the whole film area) causes decreases of the crystal defects inside the grain without changing the size of the grain grown by the first thermal treatment, whereby the device property is improved. Thus, the present invention has been accomplished.

However, the first thermal treatment is carried out at a temperature of 700° C. or lower, since this treatment at higher than 700° C. grows the polycrystalline thin film having a maximal grain size of 1 $\mu$m or less. The lower limit temperature is the temperature sufficient to effect a solid growth. Specifically, since determination of the temperature is affected by a material of an amorphous thin film, etc., it is desirable to determine it by previously carrying out an experiment, etc. On the other hand, progress of solid phase growth is not completed in case of a first thermal treatment time below 10 hours. Therefore, since it is feared that an amorphous state remains, the treatment is carried out for 10 hours or more.

Heating by a lamp light is preferred in the second thermal treatment. By such lamp heating, the temperature is raised to 1200° C. or higher in a very short time (several seconds). Temperature lowering is also performed very rapidly. Further, suitable selection of the wave length makes possible selective heating of only a Si thin film, whereby defects inside the grain can be efficiently decreased. In these two points, the use of lamp light is advantageous over the electric furnace method generally used. Especially, heating at 1200° C. or higher is difficult in the electric furnace method. Further, with regard to uniformity over a large area, the present invention is markedly improved compared with the laser heating method (scanning).

In the present invention, it is preferable that the polycrystalline semiconductor thin film formed by the first thermal treatment on which a capping material is formed is exposed to the second thermal treatment. By providing the capping material, the surface roughness of a thin film to be formed is made considerably flatter. It is believed that the capping material acts to prevent creation of surface roughness (unevenness of a surface) of a thin film likely to be caused by the second thermal treatment.

It is preferable that the capping material is SiO$_2$ or Si$_3$N$_4$ formed by sputtering. Further, it is preferable that the thickness is from 10 nm to 100 nm.

On the other hand, for controlling precisely the grain size, the temperature rising rate to the second thermal treatment temperature is preferably 100° C./sec to 500° C./sec, and the heating time in the second thermal treatment is preferably 1 to 3 minutes.

The first thermal treatment temperature described above is preferably 60 percent or lower of the melting point (Kelvin unit) of the semiconductor material in the amorphous semiconductor thin film. Similarly, the second thermal treatment temperature is preferably 85 percent or higher of the melting point (Kelvin unit) of the above semiconductor material.

EXAMPLE

Example 1

On a substrate in which SiO$_2$ thermal oxidation film with 0.1 μm thick is grown on a Si wafer, a polycrystalline Si film of 0.1 μm in thickness was formed by the reduced pressure CVD (chemical vapor deposition) method at 620° C. under 0.3 Torr. SiH$_4$ was employed as a source gas.

Si+ ion of $3 \times 10^{15}$ cm$^{-2}$ in implantation quantity was implanted into the whole region of the polycrystalline Si thin film under 40 KeV in implantation energy to modify the polycrystalline Si thin film to amorphous state.

Next, thermal treatment was carried out using an electric furnace under N$_2$ at 600° C. for 50 hours (first thermal treatment) to grow a dendritic large grain size crystal (polycrystalline Si thin film). The grain size of this polycrystalline Si thin film was observed to be 0.1 to 5 μm.

Tungsten halogen lamp light was radiated to both the surfaces of the polycrystalline Si thin film so that the Si wafer became 1400° C. at 200° C./sec in temperature rising rate, and the temperature was maintained for 1 minute (second thermal treatment). The grain size of the polycrystalline Si thin film thus formed was observed to be 0.1 to 5 μm, and the distribution of the grain size showed no change before and after the second thermal treatment.

In this Example, for preventing formation of a surface roughness of a thin film caused during lamp irradiation, SiO$_2$ (capping material) with 50 nm was sputtered to cap the surface of the polycrystalline thin film. The capping material was removed, and the surface roughness was measured. The surface roughness was within several ten angstroms.

On the thin film thus formed, a P channel MOSFET of polysilicon gate was prepared according to the IC process. The mobility was 140 cm$^2$/V.sec.

Example 2

On a quartz substrate, an amorphous Si thin film of 0.1 μm in thickness was formed by the reduced pressure CVD method. The deposition temperature was 550° C. and the pressure was 0.3 Torr.

Si+ ion was impregnated over the whole surface of this amorphous Si thin film at $1 \times 10^{15}$/cm$^2$ under 40 KeV.

Next, a thermal treatment was carried out in an electric furnace under N$_2$ at 600° C. for 50 hours to effect a solid growth. The grain size of the grown polycrystalline Si film was 0.1 to 5 μm.

On this thin film, SiO$_2$ (capping material) was coated by sputtering and then heated to 1400° C. at 200° C./sec in temperature rising rate using a tungsten halogen lamp as described in Example 1 with a Si wafer being contacted as a light absorbing material. This light heating was maintained for 1 minute. The grain size of the thin film thus formed was 0.1 to 5 μm.

The capping SiO$_2$ sputtered film was removed and a P channel MOSFET was prepared according the general IC process. The mobility was 140 cm$^2$/V.sec.

Example 3

An amorphous Si film of 0.1 μm in thickness was deposited by vacuum vapor deposition on a thermal oxidation film of 0.1 μm in thickness formed on a Si wafer. The degree of vacuum and deposition rate were $3 \times 10^{-9}$ Torr and 0.2 Å/sec, respectively. The temperature of the substrate was 300° C. during the vapor deposition. This amorphous Si film was exposed to the thermal treatment in an electric furnace under N$_2$ at 600° C. for 50 hours. After the dendritic polycrystal having a large grain size of 1 μm or more was grown, a SiO$_2$ sputtered film of 50 nm in thickness was coated as a cap. Both the surfaces were heated by radiating a tungsten halogen lamp light (wave length: 0.5 to 3.5 μm) at 200° C./sec in temperature rising rate at 1350° C. for 2 minutes. The grain size of the thin film thus formed was about 3 μm. Next, a MOSFET was prepared according to the general IC process. The mobility was 100 cm$^2$/V.sec.

What is claimed is:

1. A method for forming a semiconductor thin film which comprises:
   (i) crystallizing an amorphous thin film formed on an amorphous insulating surface of a substrate by a first thermal treatment at 700° C. or lower for at least ten hours to form a crystallized thin film having a grain size of at least 1 μm;
   (ii) providing a capping material on said crystallized thin film; and
   (iii) rapidly heating said crystallized thin film to a temperature of 1200° C. or higher by irradiating said crystallized thin film with a lamp light and conducting a second thermal treatment at 1200° C. or higher by keeping said crystallized thin film at a temperature of 1200° C. or higher for about 1 to 3 minutes while maintaining said grain size, thereby forming said semiconductor thin film.

2. A method for forming a semiconductor thin film according to claim 1, wherein said capping material is silicon oxide or silicon nitride.

3. A method for forming a semiconductor thin film according to claim 2, wherein the thickness of said capping material is from 10 nm to 100 nm.

4. A method for forming a semiconductor thin film according to claim 2, wherein the temperature rising rate in the second thermal treatment is from 100° C./sec to 500° C./sec.

5. A method for forming a semiconductor thin film according to Claim 1, wherein the thickness of said capping material is from 10 nm to 100 nm.

6. A method for forming a semiconductor thin film according to claim 5, wherein the temperature rising rate to the second thermal treatment is from 100° C./sec. to 500° C./sec.

7. A method for forming a semiconductor thin film according to Claim 1, wherein the temperature rising rate to the second thermal treatment temperature is from 100° C./sec to 500° C./sec.

8. A method according to claim 1, wherein the amorphous material thin film is an amorphous silicon thin film.

9. A method according to claim 1, wherein the amorphous material thin film is formed on the substrate by deposition.

10. A method according to claim 1, wherein the amorphous thin film is formed by making a polycrystalline material thin film formed on said amorphous insulating surface of the substrate amorphous.

11. A method for forming a semiconductor thin film which comprises:
   (i) subjecting an amorphous material thin film formed on an amorphous insulating surface of a substrate to a first thermal treatment at 700° C. or lower for at least ten hours to generate a nucleus in the amorphous material thin film;
   (ii) growing the nucleus, thereby crystallizing the amorphous material thin film to form a crystallized thin film having a grain size of at least 1 μm;

(iii) providing a capping material on said crystallized thin film; and (iv) rapidly heating said crystallized thin film to a temperature of 1200° C. or higher and subjecting said crystallized thin film to a second thermal treatment at 1200° C. or higher for about 1 to 3 minutes while maintaining said grain size, thereby forming said semiconductor thin film.

12. A method according to claim 11, wherein the second thermal treatment is carried out by use of a lamp.

13. A method according to claim 11, wherein the crystallized amorphous material thin film is polycrystalline.

14. A method according to claim 11, wherein the second thermal treatment is carried out after setting a desired temperature at a rate of 100° C./sec to 500° C./sec.

15. A method for forming a semiconductor thin film according to claim 11, wherein said capping material is silicon oxide or silicon nitride.

16. A method for forming a semiconductor thin film according to claim 15, wherein the thickness of said capping material is from 10 nm to 100 nm.

17. A method for forming a semiconductor thin film according to claim 11, wherein the thickness of said capping material is from 10 nm to 100 nm.

18. A method for forming a semiconductor thin film which comprises (i) subjecting an amorphous material thin film formed on an amorphous insulating surface of a substrate to a first thermal treatment at 700° C. or lower for at least ten hours to generate a nucleus in the amorphous material thin film;

(ii) growing the nucleus, thereby crystallizing the amorphous material thin film to form a crystallized thin film having a grain size of at least 1 $\mu$m;

(iii) rapidly heating said crystallized thin film to a temperature of 1200° C. or higher and subjecting said crystallized thin film to a second thermal treatment by keeping said crystallized thin film at 1200° C. or higher for 1 to 3 minutes while maintaining said grain size, thereby forming said semiconductor thin film.

19. A method according to claim 18, wherein said second thermal treatment is carried out by use of a lamp.

20. A method according to claim 18, said crystallized amorphous material thin film is polycrystalline.

21. A method according to claim 18, wherein said second thermal treatment is carried out after setting a desired temperature at a rate of 100° C./sec to 500° C./sec.

22. A method according to claim 18, wherein a capping material is provided on said crystallized thin film before said second thermal treatment.

23. A method according to claim 22, wherein said capping material is silicon oxide or silicon nitride.

24. A method according to claim 22, wherein the thickness of said capping material is from 10 nm to 100 nm.

25. A method according to claim 22, said capping material is provided to prevent the surface unevenness of said crystallized thin film.

* * * * *

UNITED STATES PATENT AND TRADEMARK OFFICE
CERTIFICATE OF CORRECTION

PATENT NO. : 5,278,093
DATED : January 11, 1994
INVENTOR(S) : TAKAO YONEHARA

It is certified that error appears in the above-identified patent and that said Letters Patent is hereby corrected as shown below:

ON TITLE PAGE

In [56] References Cited, under OTHER PUBLICATIONS:
In "Crystal Defect", "SiO2" should read --$SiO_2$--.
In "Characterization", "SiO2," should read --$SiO_2$,--.

COLUMN 1

Line 49, "inventer" should read --inventor--.
Line 57, "inventer" should read --inventor--.

COLUMN 2

Line 43, "inventer" should read --inventor--.

COLUMN 3

Line 58, "40 $cm^2$/V.sec" should read --40 $cm^2$/V.sec.--.

COLUMN 6

Line 32, "claim 2," should read --claim 1,--.
Line 35, "claim 2," should read --claim 1,--.
Line 39, "claim 1," should read --claim 2,--.
Line 42, "claim 5," should read --claim 3,--.
Line 46, "claim 1," should read --claim 2,--
Line 47, "to" should read --in-- and
"temperature" should be deleted.

UNITED STATES PATENT AND TRADEMARK OFFICE
CERTIFICATE OF CORRECTION

PATENT NO. : 5,278,093
DATED : January 11, 1994
INVENTOR(S) : TAKAO YONEHARA

It is certified that error appears in the above-identified patent and that said Letters Patent is hereby corrected as shown below:

COLUMN 7

Line 30, "comprises" should read --comprises:--.

Signed and Sealed this

Twentieth Day of September, 1994

Attest:

BRUCE LEHMAN

*Attesting Officer*   *Commissioner of Patents and Trademarks*